(12) United States Patent
Thing et al.

(10) Patent No.: US 11,510,491 B2
(45) Date of Patent: Nov. 29, 2022

(54) CABINET FRAME ASSEMBLED BY FOLDED PROFILES

(71) Applicant: KK WIND SOLUTIONS A/S, Ikast (DK)

(72) Inventors: Poul Thing, Ikast (DK); Jørgen Dahl Vestergaard, Kibæk (DK)

(73) Assignee: KK WIND SOLUTIONS A/S, Ikast (DK)

( * ) Notice: Subject to any disclaimer, the term of this patent is extended or adjusted under 35 U.S.C. 154(b) by 3 days.

(21) Appl. No.: 16/969,716

(22) PCT Filed: Feb. 22, 2019

(86) PCT No.: PCT/DK2019/050067
§ 371 (c)(1),
(2) Date: Aug. 13, 2020

(87) PCT Pub. No.: WO2019/161869
PCT Pub. Date: Aug. 29, 2019

(65) Prior Publication Data
US 2021/0006046 A1    Jan. 7, 2021

(30) Foreign Application Priority Data

Feb. 23, 2018   (DK) .......................... PA 2018 70123

(51) Int. Cl.
*A47B 47/00* (2006.01)
*A47B 47/04* (2006.01)
(Continued)

(52) U.S. Cl.
CPC ...... *A47B 47/0058* (2013.01); *A47B 47/0083* (2013.01); *A47B 47/02* (2013.01); *A47B 47/045* (2013.01); *A47B 96/1433* (2013.01)

(58) Field of Classification Search
CPC . A47B 47/0058; A47B 47/0083; A47B 47/02; A47B 47/021; A47B 47/027;
(Continued)

(56) References Cited

U.S. PATENT DOCUMENTS

| 283,136 | A | * | 8/1883 | Mosler | ................... | B21D 53/00 |
| | | | | | | 29/897 |
| 2,808,309 | A | * | 10/1957 | Magester | ................ | F16B 12/08 |
| | | | | | | 312/257.1 |

(Continued)

FOREIGN PATENT DOCUMENTS

| CN | 1345180 A | 4/2002 |
| CN | 102773374 A | 11/2012 |

(Continued)

OTHER PUBLICATIONS

Screen captures from YouTube video clip entitled "Square steel tubes bending", CMM laser, Jun. 12, 2012. Retrieved from internet: https://www.youtube.com/watch?v=be4LrGn0IPg on Sep. 12, 2018. See video 0:10-0:20, 0:30-0:40 and 0:50-1:45 and the accompanying text: "With this innovative solution you can build many things: frames, chassis and steel structures".

(Continued)

*Primary Examiner* — Andrew M Roersma
(74) *Attorney, Agent, or Firm* — Pearne & Gordon LLP

(57) ABSTRACT

The application relates to a method of establishing four profiles which when releasably mounted together are forming a cabinet frame. The profiles are having folding areas comprising cutout parts.

8 Claims, 7 Drawing Sheets

Figure 1A:
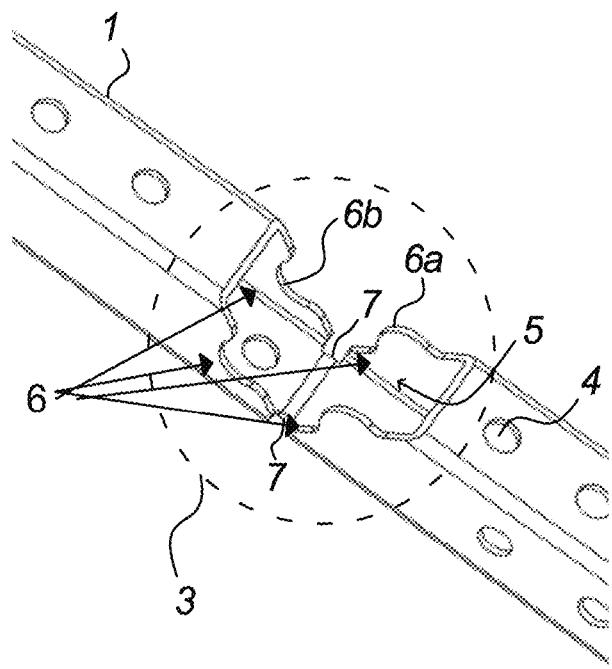

(51) Int. Cl.
*A47B 47/02* (2006.01)
*A47B 96/14* (2006.01)

(58) Field of Classification Search
CPC ....... A47B 47/03; A47B 47/04; A47B 47/045;
A47B 47/05; A47B 55/00; A47B 96/14;
A47B 96/1416; A47B 96/1433; A47B 96/1441
See application file for complete search history.

(56) References Cited

U.S. PATENT DOCUMENTS

| | | | | |
|---|---|---|---|---|
| 3,437,392 A | * | 4/1969 | Hilfinger | A47B 88/9414 312/258 |
| 3,766,863 A | * | 10/1973 | Swick, Jr. | A47B 47/021 211/90.01 |
| 3,881,794 A | * | 5/1975 | Henning | A47B 96/202 312/259 |
| 4,692,984 A | * | 9/1987 | McKernan | A47B 55/00 228/142 |
| 5,231,862 A | * | 8/1993 | Ashley | A47B 55/00 29/897.312 |
| 10,034,543 B1 | * | 7/2018 | Burnett | A47B 96/202 |
| 2013/0307388 A1 | | 11/2013 | Zhang | |
| 2014/0186650 A1 | | 7/2014 | Wunsch | |
| 2016/0363150 A1 | * | 12/2016 | Schindler | F16B 12/50 |
| 2018/0199707 A1 | * | 7/2018 | Burnett | A47B 47/0083 |

FOREIGN PATENT DOCUMENTS

| | | | | |
|---|---|---|---|---|
| CN | 102933059 A | | 2/2013 | |
| CN | 103340025 A | | 10/2013 | |
| CN | 103561879 A | | 2/2014 | |
| CN | 106862380 A | | 6/2017 | |
| DE | 2233200 A1 | * | 1/1974 | ............. A47B 47/03 |
| EP | 3 326 930 A1 | | 5/2018 | |
| KR | 2017-0114885 A | | 10/2017 | |
| WO | 2008-124909 A1 | | 10/2008 | |
| WO | 2017-013275 A1 | | 1/2017 | |
| WO | 2018-029438 A1 | | 2/2018 | |

OTHER PUBLICATIONS

International Search Report Issued in Patent Application No. PCT/DK2019/050067 dated May 13, 2019.
Written Opinion Issued in Patent Application No. PCT/DK2019/050067 dated May 13, 2019.
Danish Search Report Issued in Patent Application No. PA 2018 70123 dated Sep. 13, 2018.
Chinese Office Action dated Jan. 20, 2021 in Chinese Patent Application No. 201980014872.4.

* cited by examiner

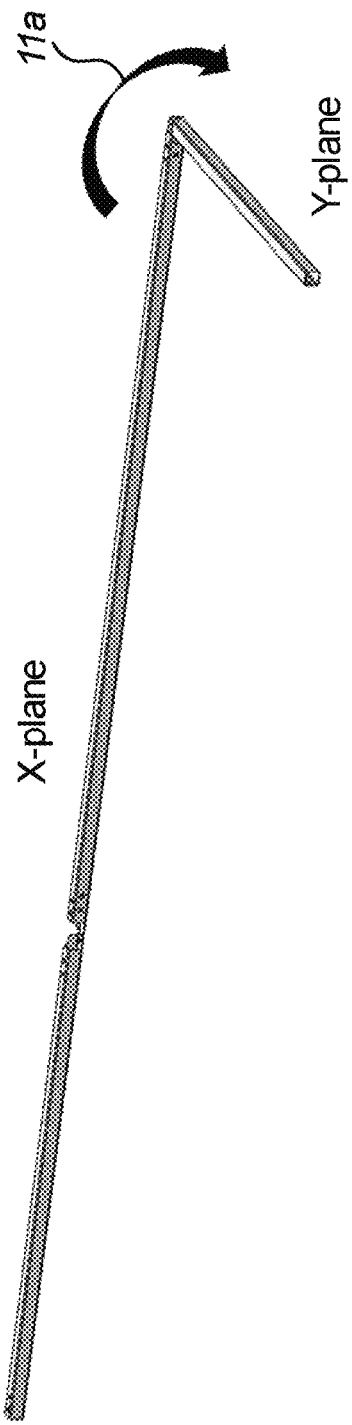

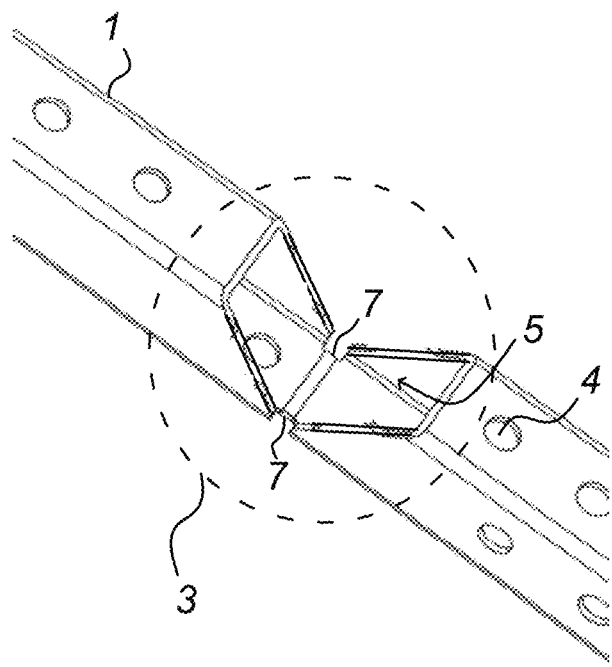
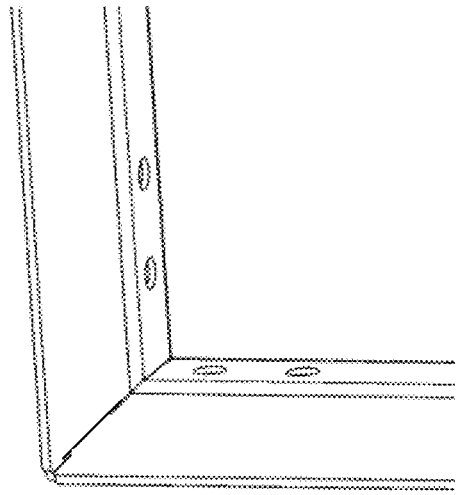
Fig. 6a  Fig. 6b
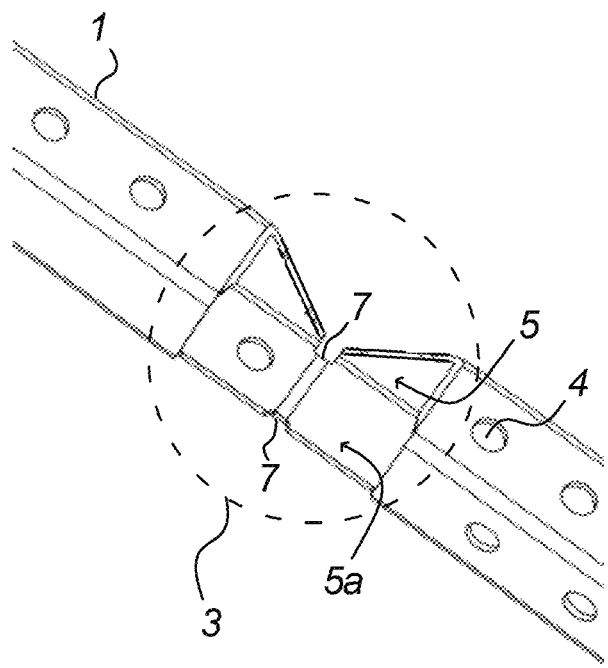
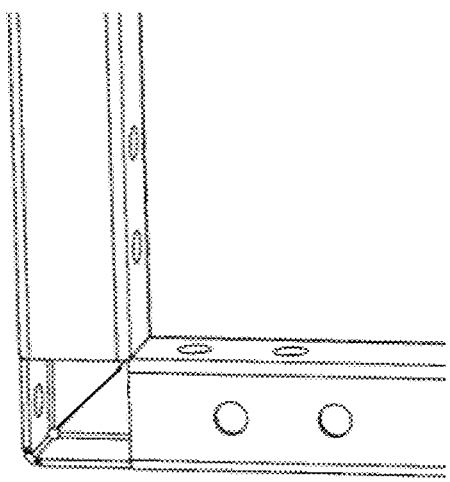
Fig. 7a  Fig. 7b

CABINET FRAME ASSEMBLED BY FOLDED PROFILES

FIELD OF THE INVENTION

The invention relates to a method of assembling a cabinet frame from a plurality of folded profiles, a cabinet frame and a cabinet frame assembly.

BACKGROUND OF THE INVENTION

Cabinets for electric components and control systems are used in many different sizes. Typically, cabinets are built of a heavy metal frame to which side panels are mounted which together forms a suitable enclosure for high power components, heavy cobber conductors, control systems, etc.

Due to the different use of cabinets and environment in which the cabinets are used a variety of different cabinet designs exists. In some technical fields such as cabinets for high power electric systems, cabinets are typically designed according to a specification describing e.g. IP classification, height, depth and width of the cabinet. Based on the specifications, the cabinet frame is produced and equipped with side panels and electric components.

Known methods of producing cabinet frames include prior art document WO2008124909. Here it is described how to make several "V" cuts in a cabinet profile allowing to bend the profile along a transversal fold line and thereby creating front and back frames. The front and back frames are then connected to each other via depth profiles mounted to the front and back frames by couplings.

Prior art cabinets including the one disclosed in WO2008124909 requires time consuming manual assembling. Further, the stability of prior art cabinets is not always sufficient before side panels are mounted.

SUMMARY OF THE INVENTION

It is therefore an object of the present invention to provide a cabinet frame which is lightweight, stable and easy to assemble, therefore the invention relates to a method of assembling a cabinet frame, the method comprising the steps of: establishing a first folding area in a profile, the first folding area comprise a cutout part oriented in a first direction, establishing a second folding area in the profile, the second folding area comprise a cutout part oriented in a second direction different from the first direction, folding the profile at the first folding area in the first direction defined by the cutout part, folding the profile at the second folding area in the second direction defined by the cutout part, repeating steps a)-d) to establish four folded profiles, and connecting the four profiles to a cabinet frame.

The above method is advantageous in that the cabinet frame is created from four identical profiles which can be prepared and folded on site of assembling the cabinet frame.

Further, the effect of assembling a cabinet frame according to the above method is that the folding operations and assembly of the folded profiles requires no particular skills or strength from the person carrying out the method. Accordingly, the assembly of the cabinet frame can be made on the factory floor of the site where the cabinet frame is needed (i.e. for mounting with electric equipment). Thereby, transport and storage volume of cabinet frames are reduced significantly in that four non-folded profiles takes op significantly less volume/space than assembled cabinet frames.

According to an embodiment of the invention, the step of connecting the four profiles 1a-1d to a cabinet frame includes the steps of: connecting profile 1a and profile 1b, thereby forming a first side and part of a second side and fourth side of the cabinet frame, connecting profile 1c to profile 1b, thereby forming the second side and part of a third side of the cabinet frame, and connecting profile 1d to profile 1c and profile 1a, thereby forming the third and fourth sides of the cabinet frame.

In this way four (preferably) identical profiles are established which when connected forms a cabinet frame. Individually, the four profiles each constitute one horizontal and two vertical (or vice versa) elements of a cabinet frame (when each of the folding areas are folded 90° degrees).

According to an embodiment of the invention, the step of connecting the four profiles to a cabinet frame includes the steps of: connecting profile 1a and profile 1b, thereby forming a first cabinet part 2a, connecting profile 1c and profile 1d, thereby forming a second cabinet part 2b, and connecting the first and second cabinet parts 2a, 2b, thereby forming the cabinet frame.

This is advantageous in that it has the effect, that a cabinet frame can be assembled from connecting the first and second cabinet part in one direction. Accordingly, this eases automatization of the cabinet assembly process.

According to an embodiment of the invention, the orientation of the second folding area is established in the profile perpendicular to the orientation of the first folding area, and wherein the first and second folding areas further includes an additional cut-out part.

This is advantageous in that it has the effect, that the profiles when folded can be used to form a square formed cabinet frame.

According to an embodiment of the invention, step c and step d includes mounting a corner fitting in the profile at the first folding area and at the second folding area prior to folding, wherein a first part of the corner fitting is mounted inside the profile leaving a second part of the corner fitting extending outside the profile at the additional cut-out part when the profile is folded.

The corner fitting is advantageous in that has the effect, that it enables easy mounting of an end of one profile to a corner of another profile.

According to an embodiment of the invention, the profiles and/or cabinet parts are mounted by means of corner fittings.

This is advantageous in that it has the effect, that assembly can be made very fast and with identical corner fittings in each of the connections of profiles. This is furthermore advantageous in that this eases automatization of the cabinet assembly process.

According to an embodiment of the invention, the corner fitting comprises a nut, threaded part or a flexible protruding part by means of which the corner fitting is fastened to the profile. Advantageous in that it has the effect, that the corner fitting is then releasably fastened by the bolt or by friction.

Preferably the nut or threaded part is embedded e.g. by molding, pressed or 3D printed to the corner fitting which thereby holds the nut or threaded part when a bolt is inserted and tightened through a hole in the profile for fastening the corner fitting to the profile. The flexible protruding part is advantageous in that assemble of the cabinet can be made without use of bolts.

According to an embodiment of the invention, at least one of step a and step b further includes establishing a folding angle support part, and wherein at least one of step c and step d further includes folding the profile in an angle defined by the folding angle support part.

Moreover, the invention relates to a cabinet frame assembled by four folded profiles each having a first folding area (3a) and a second folding area (3b), wherein the first folding area comprise a cutout part oriented in a first direction and the second folding area comprises a cutout part oriented in a second direction, wherein the second direction is perpendicular to the first direction.

According to an embodiment of the invention, at least one of the first and second folding areas further comprises a folding angle support part, wherein the folding angle support part comprise a protruding part and a cave in part. The folding angle support part is advantageous in that it has the effect, that it has the effect of increasing precision of/defining the folding angle (angle in which the profile is folded at the folding areas) and stability of the "folded corner".

The four profiles are preferably similar profiles forming the main supporting structure of the cabinet (also referred to as enclosure) i.e. the main frame of the cabinet is built from such profiles. Similar should here be understood as structural identical i.e. all having two folding areas. Accordingly, number of holes, notch, caving's, etc. may not be the same on each profile. The cabinet is preferably an electric cabinet, but could in principle be any kind of enclosure.

The cutout part is formed by completely removing part of the profile material from at least part of the folding area. The profile material is removed from both sides of the predetermined folding line on the opposite side of the profile relative to the folding line. Hence, the cutout part is advantageous in that it has the effect, that it allows the profile to be folded.

The folding angle support part is advantageous in that it has the effect that it ensures that the angle of which the profile is folded is precisely the intended angle. This is ensured when contact is obtained between the protruding part and the cave in part of the folding angle support part.

Further, the folding angle support part has the effect, that it can be easily determined if the profile is folded in the right plane. Hence an accurate fold of the profile will result in that the outer (and inner) side of the protruding part of the folding angle support part is in the same plane as the outer (and inner) side of the cave in part of the folding angle support part when the profile is folded.

Further, the folding angle support part has the effect, that when the profile is folded, the interaction of the protruding part in the cave in part maintains the profile in its folded position. This interaction between surface of the protruding and cave in part further has the effect, that the length of the interaction of surfaces is longer than known straight interactions and thereby the fold becomes more stable.

According to an embodiment of the invention, the folding area further comprise at least one folding recess located between the protruding part and cave in part of the folding angle support part.

The folding recess is advantageous in that it has the effect, that deformation of the profile material removed to create the folding recess is not required. This leads to less force needed to fold the profile and it eliminates the need for post-treatment of the deformed profiled material if a plane surface of the profile is desired.

Preferably, the folding area comprise two folding recesses positioned on opposed sides of the same plane/side or folding line about which the profile is folded.

Two folding recesses are advantageous in that there between a predetermined folding line is formed. The folding recesses and the folding line has the effect that it becomes possible with limited force (i.e. manually) to fold the profile precisely at the predetermined folding line without deformation of the profile material. Further, such folding line has the effect that the fold of the profile will naturally follow the folding line According to an embodiment of the invention, the folding area comprise an additional cutout part.

The additional cutout part is advantageous in that it facilitates mounting a corner support element, having the effect of enabling mounting of a further profile (folded or un-folded) to the folded profile. Hence by the corner support element, it becomes possible to connect one profile to another profile thereby forming the resulting cabinet frame. Accordingly, the additional cutout part of the first folding area is "rotated" 90 degrees compared to the cutout part of the second folding area and therefore cut out in two adjacent sides of a square formed profile. In the embodiment where angle support parts are part of the folding areas, these are also rotated, but may in addition be mirrored depending which direction to folding area needs to be folded.

According to an embodiment of the invention, the folding area comprise one or more holes.

The one hole which is preferred has the effect, that it facilitates fastening the cabinet frame, when assembled, to a cabinet base/foundation or to another cabinet frame.

If a plurality of holes is provided, they are preferably provided asymmetric on both sides of the folding area.

Further, if a plurality of holes is provided in the profile these are advantageous in that they have the effect, that a corner support can be precisely fixed in a predetermined position to the profile thereby maintaining a desired angle of the folded profile.

Further, if a plurality of holes is provided in the profile these are advantageous in that they have the effect, that a corner fitting can be attached to both sides of the folding area when folded thereby increasing stability of the cabinet frame at least when side panels are not mounted on the cabinet frame e.g. during transportation or mounting of e.g. electric parts in the cabinet.

According to an embodiment of the invention, at least part of the one or more holes facilitates fastening a corner support to the profile.

This is advantageous in that it has the effect that stability of the folded profile is increased.

Using a corner support is advantageous in that it has the effect that by these corner supports two adjacent cabinets can be fastened together.

The corner support element is preferably made of a metal or similar material as the profile, a preferred material is aluminium.

One or more of the plurality of holes is preferably used for securing the assembled cabinet frame to a base or foundation.

According to an embodiment of the invention, a corner fitting comprises a first corner fitting part facilitating fastening the corner fitting to the profile, preferably by fastening the first corner fitting part inside the profile.

Preferably the corner fitting is an independent part which can be crated from a 3-dimensional (3D) printing process or molded.

According to an embodiment of the invention, one of the one or more holes facilitates fastening the first part of the corner fitting inside the profile by means of a bolt.

In an embodiment, the corner fitting comprises a nut by means of which the corner fitting can be fastened to the profile by means of a bolt. Preferably, the nut is molded or in another way fastened to the corner fitting which thereby holds the nut when a bolt is inserted and tightened through a hole in the profile for fastening the corner fitting to the profile.

In an embodiment, the corner fitting comprises a threated part which facilitates tightening/fastening a bolt directly to the threated part of the corner fitting. The threated part can be provided e.g. by 3D printing of the corner fitting.

According to an embodiment of the invention, the first part of the corner fitting comprises a flexible protruding part.

A flexible protruding part is advantageous in that it has the effect, that mounting the corner fitting inside the profile can be made without bolts and nuts. This is due to the friction or displacement of the flexible protruding part against the inside of the profile when the corner fitting is mounted inside the profile.

According to an embodiment of the invention, the corner fitting comprises a second corner fitting part which is perpendicular relative to the first part of the corner fitting and which extends outward in a direction perpendicular to the profile when mounted in the profile.

This is advantageous in that it has the effect, that when the corner fitting is mounted in the profile, via the perpendicular second corner fitting part, the profile can be mounted to another profile i.e. connection of two profiles is then facilitated.

The corner fitting is preferably made of a material different from the material of the profile. Preferably, the corner fitting is made of a plastic material strong enough to hold a nut or threated part, thereby facilitating fastening the corner fitting and the profile by means of a bolt.

According to an embodiment of the invention, the second folding area is rotated 90 degrees on the profile with respect to the first folding area. Having two folding areas is advantageous in that it has the effect, that it then becomes possible to form three sides of a cabinet frame from the same profile.

Accordingly, having a third folding area would lead to the possibility of forming four sides of a cabinet and so on.

Rotating a second folding area compared to a first folding area is advantageous in that it has the effect, that the three sides of a cabinet frame then is in three different planes. Accordingly, if the second folding area is folded 90° degrees with respect to the first folding area, part of a rectangular or quadratic cabinet frame is formed. Especially when folding e.g. a rectangular cabinet frame, it is advantegeous to form three sides i.e. high, depth and width from one profiled, because it has the effect that the resulting panel becomes more stable that cabinet profiles formed for folded profiled in only two planes.

According to an embodiment of the invention, the profile is a square formed profile.

A square formed profile is advantageous in that it has the effect, that the resulting cabinet frame has one side of the square formed profile to which it is possible to mount e.g. side panels, components, plates, drawers etc. the entire profile are plane.

According to an embodiment of the invention, the profile is circular.

A circular formed profiled adds flexibility to the dimensions in which a cabinet frame can be designed in that it has the effect, that in contrary to square formed profiles which can only be folded in four planes with 90° degrees between, a circular profile can be folded in any plane.

According to an embodiment of the invention, the profile is made of aluminium, steel or plastic.

Plastics is preferably coated with e.g. a glass fibre material to improve strength. Plastics is advantageous in that it has the effect, that it is possible to deform, lighter and cheaper than metal materials.

Aluminium is advantageous in that it is not attacked by corrosion and together with steel, it is advantageous in that it is a strong material leading to a solid and ridged resulting panel.

According to an embodiment of the invention, the outer dimensions of the profile are preferably between 10×10 mm and 50×50 mm. Standard dimensions are in steps of 5 mm and therefore steps of 5 mm are preferred sizes between the 10×10 mm and 50×50 mm. The thickness of the profiles is preferably between 1 and 2,5 mm.

If size and weight of the panel or material to be kept inside the panel requires so, the material of the profile can be even larger. It should be mentioned that the profile preferably is not massive i.e. a space is available inside the profile allowing mounting of corner fittings inside the profile.

According to an embodiment of the invention, each of the four profiles form part of one vertical part (vp) and two horizontal part (hp) of the cabinet frame when the cabinet frame is in its upright position.

This is advantageous in that it has the effect, that the cabinet frame is easy to assemble maintain sufficient stability.

According to an embodiment of the invention, each of the four profiles comprise two folded corners each having a corner support element facilitating fastening one of the corners of a first of the four profiles to the end of a second of the four profiles.

Moreover, the invention relates to a cabinet frame assembly including four profiles and eight identical corner fittings, wherein the four profiles are identical in that they are all having a first folding area and a second folding area, wherein the folding areas comprises a cutout part and an additional cutout part, wherein the cutout parts are turned 90 degrees on the profile with respect to the additional cutout part, wherein the corner fittings are having a first part perpendicular to a second part (9*b*), wherein the dimensions of the first and second parts are identical thereby facilitating mounting inside the profiles, and wherein the additional cutout part facilitates one of the first or second part to extend out from the profile when the opposite of the first or second part is mounted inside the profile.

According to an embodiment of the invention, the first and second areas further comprises a folding angle support part comprising a protruding part and a cave in part.

THE DRAWINGS

Figure 1B:
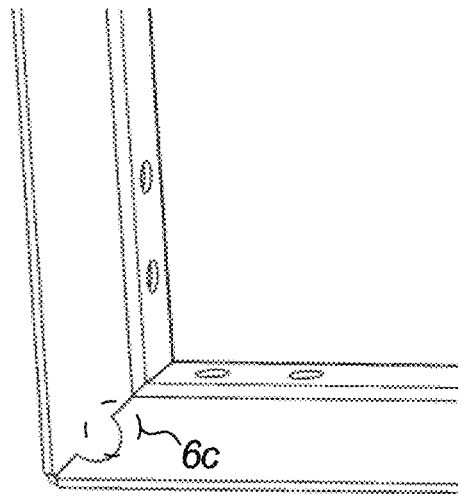
Figure 2A:
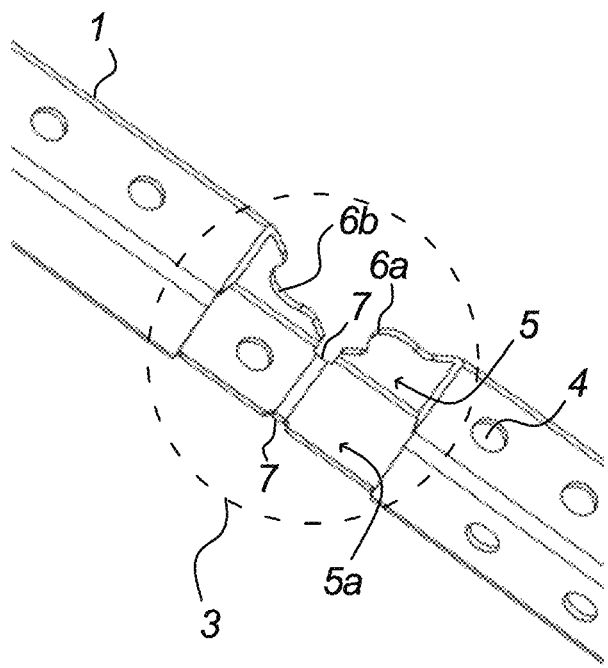
Figure 2B:
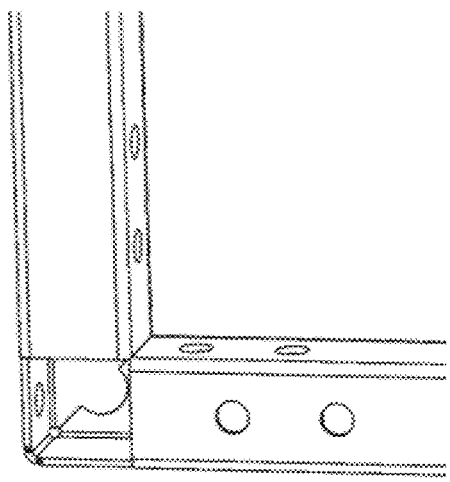
Figure 3:
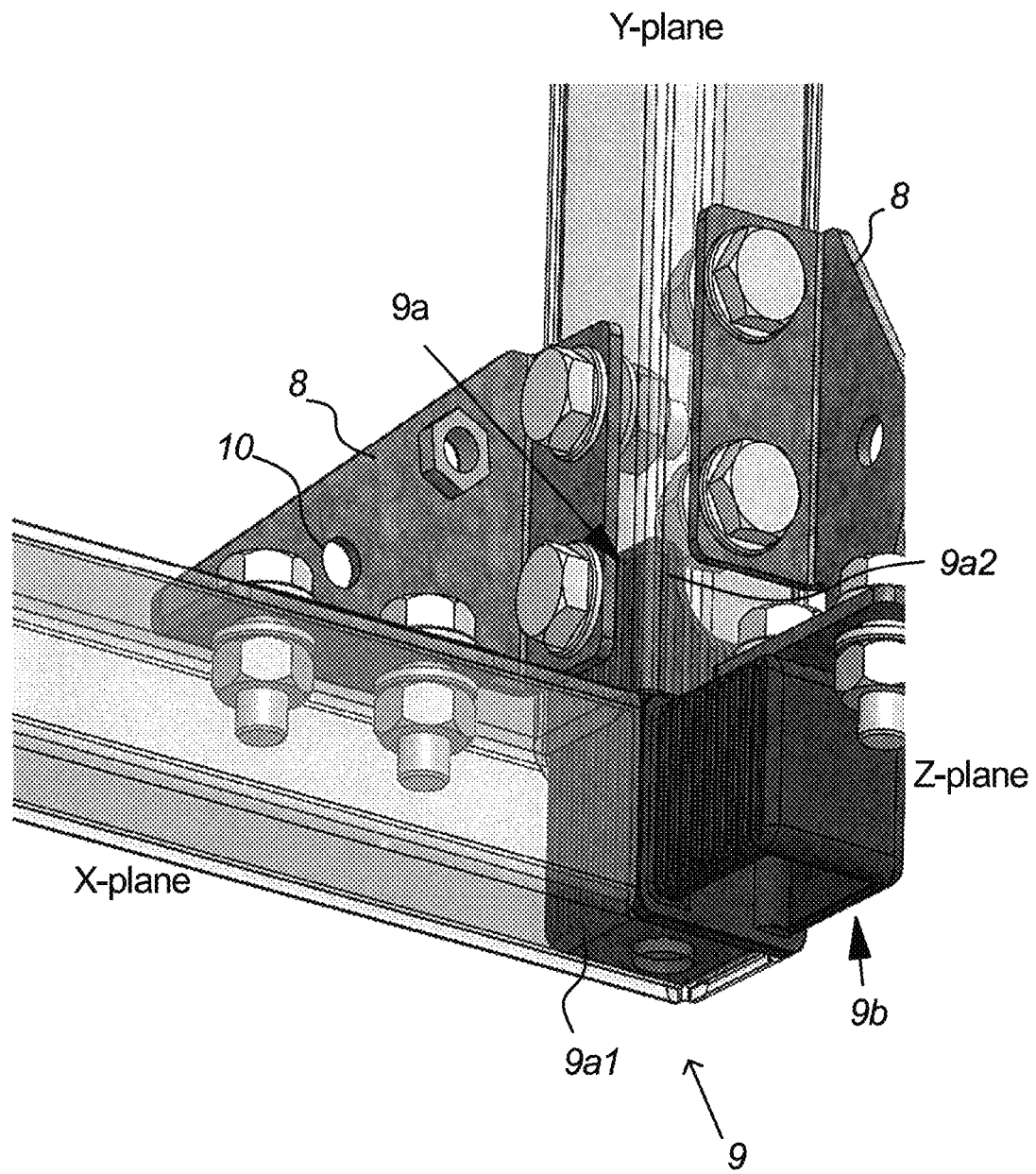
Figure 4A:
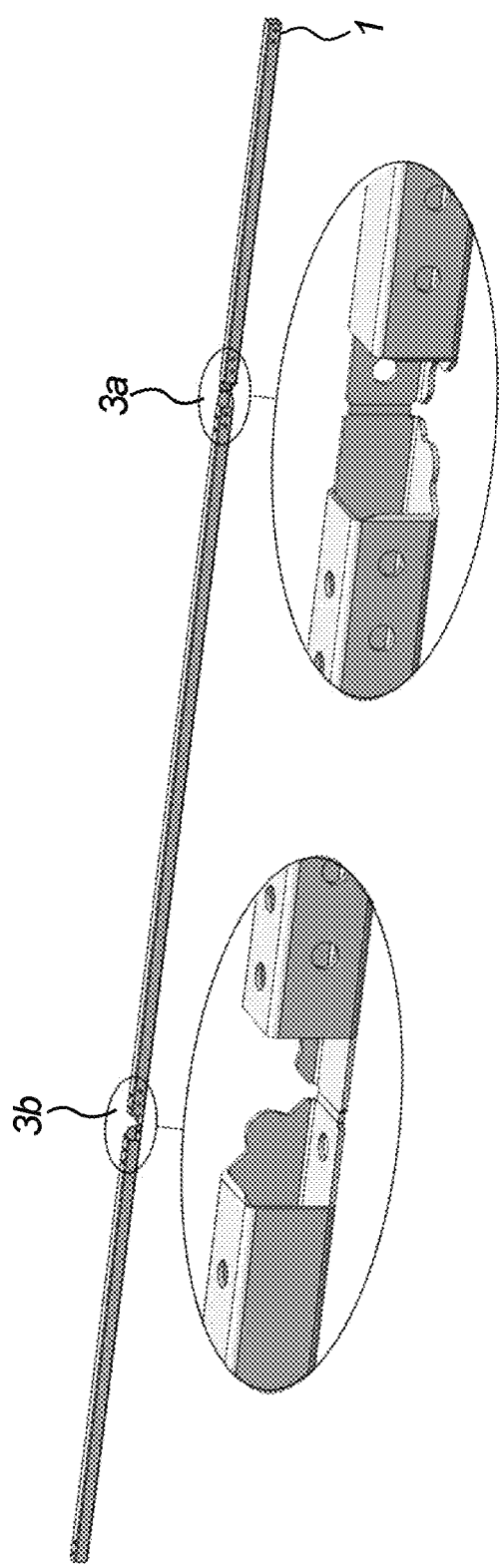
Figure 4C:
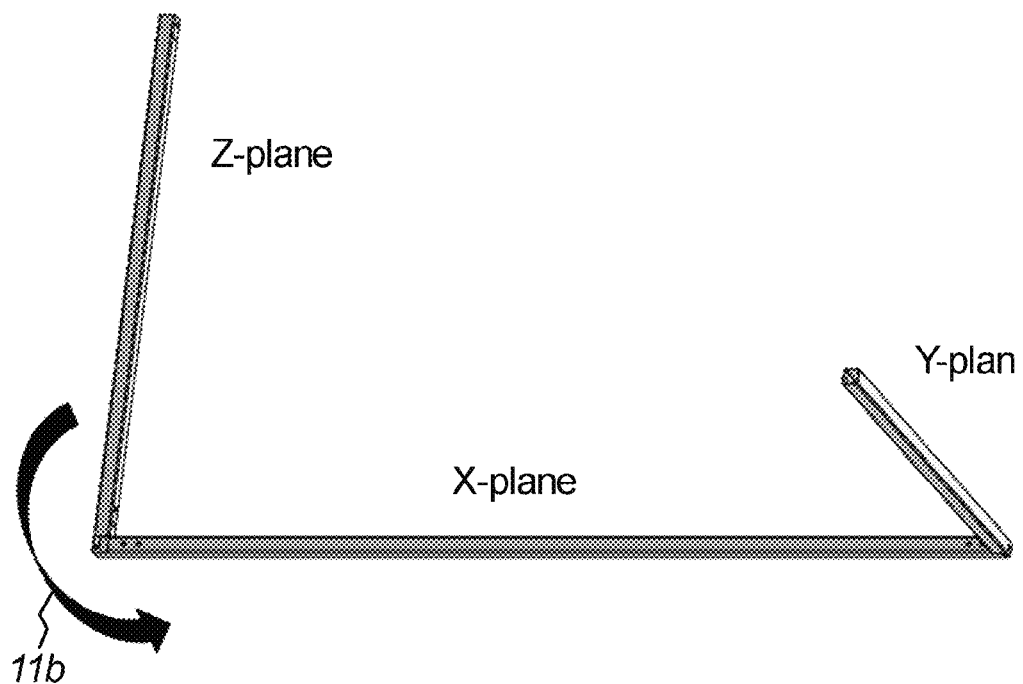
Figure 4D:
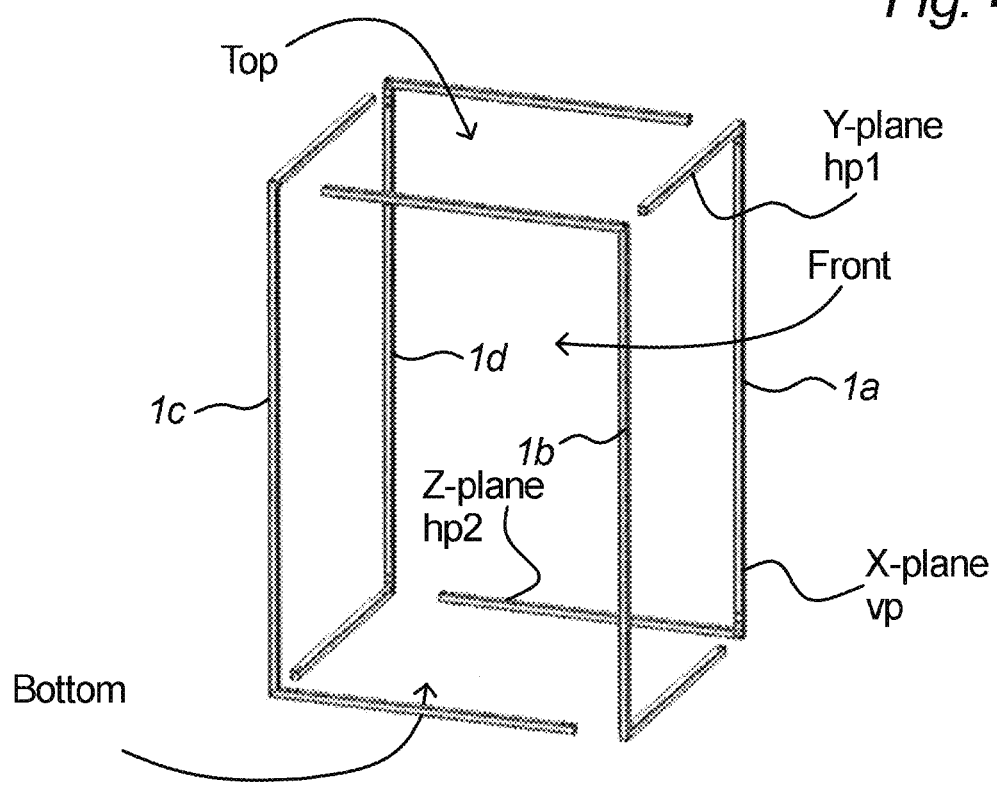
Figure 5:
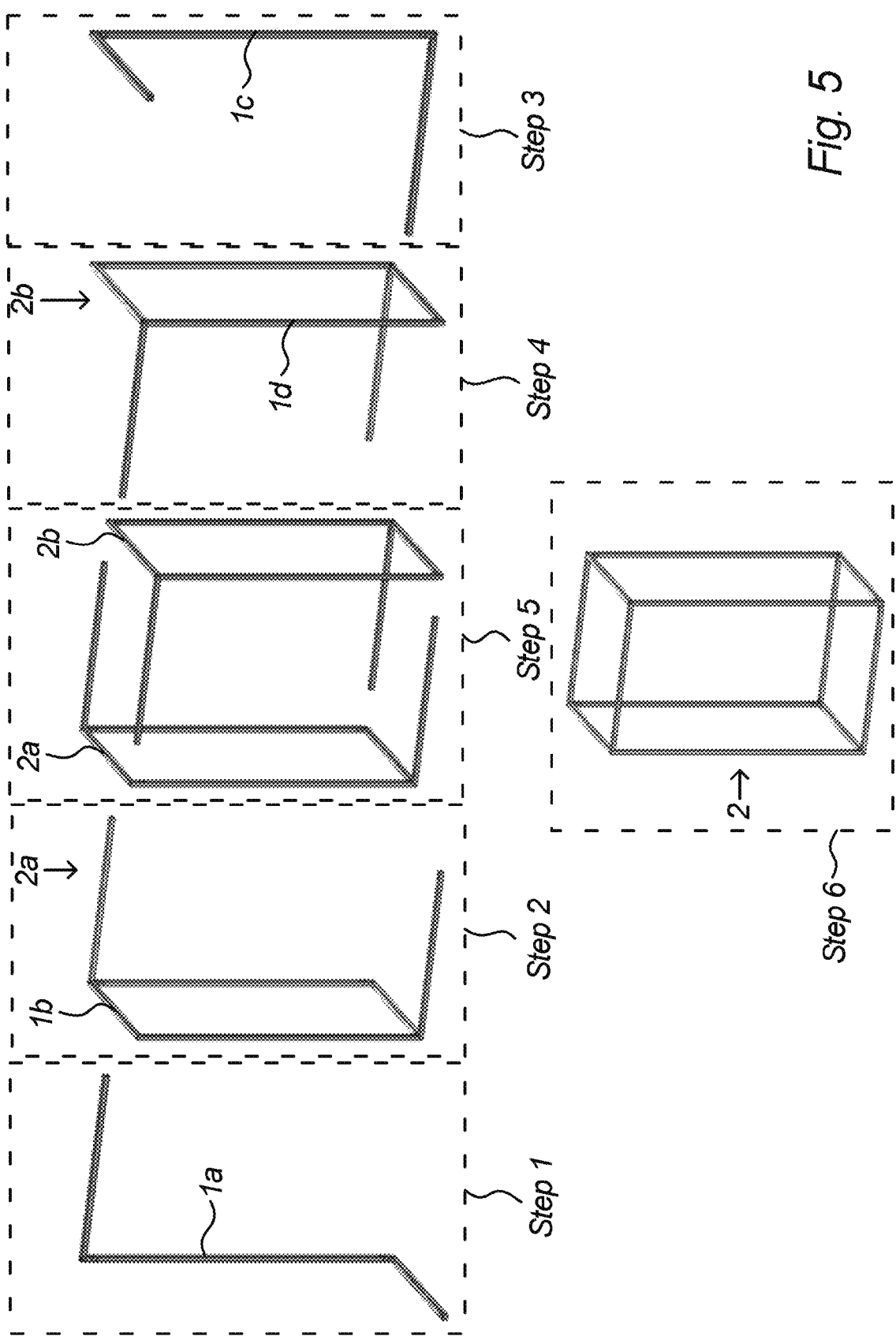

For a more complete understanding of this disclosure, reference is now made to the following brief description, taken in connection with the accompanying drawings and detailed description, wherein like reference numerals represent like parts:

FIG. 1*a*-*b* illustrates a profile with a folding area according to one embodiment, FIG. 2*a*-*b* illustrates a profile with a folding area according to a second embodiment, FIG. 3 illustrates a profile folded comprising corner fitting and corner support, FIG. 4*a*-*d* illustrates steps of folding profile and assembling a cabinet according to an embodiment, FIG. 5 illustrates steps of folding profile and assembling a cabinet according to another embodiment, and FIG. 6*a*-*b* and 7*a*-*b* illustrates an alternative embodiment of a profile with a folding area.

DETAILED DESCRIPTION

FIG. 1 illustrates a profile 1 in a non-folded (FIG. 1*a*) and in a folded (FIG. 1*b*) position. The profile 1 is used to form a cabinet frame 2. FIG. 1*a* illustrates part of a profile 1 comprising a folding area 3. The folding area 3 comprising a folding angle support part 6. The folding angle support part 6 comprising a protruding part 6a and a cave in part 6b. Further, the folding area comprising an area of the profile 1 where the profile material is cutout, this area is referred to as cutout part 5. The cutout profile material is removed in the cutout part 5 to enable folding of the profile 1.

The main purpose of the folding angle support part 6 is to increase precision of the angle of the fold and add stability to the folded profile. Precision in that it is very difficult to fold the profile above the angle determined by the support part 6 and it is obvious and easy to visually determine if the fold angle is not reached yet. Stability in that when folded, force (friction) in part of the support part 6c (see FIG. 1b) facilitates a locking functionality preventing the fold angle from being reduced when the fold has been made.

In addition, the folding area 3 may comprise one or more holes 4 that may serve different purposes (most of the holes 4 is preferably located outside the folding area 3). One purpose is to facilitate fastening of the profile to another profile or to a base frame on top of which the profile and thereby the resulting cabinet frame can be mounted. Another purpose is to fasten a corner fitting 9 and/or a corner support 8 to the profile 1.

In addition, the folding area 3 may comprise a folding recess 7 preferably on both sides of the profile 1 as illustrated. The purpose of the folding recess 7 is to reduce the force which is needed for folding the profile 1. The reduced forces needed is obtained by the removal of profile material which creates the folding recess 7 that ensures that no profile material needs to be deformed during folding. A side effect is that the sides of the profile 1 is plane and is not disturbed by some deformed profile material as result of the folding.

In addition, when the folding area 3 comprise a folding recess 7 in both sides of the profile 1, a folding line between the two folding recesses 7 which can be referred to as a predetermined folding line. This is because when the folding recesses 7 are established, the line here between is the weakest part of the folding area 3 and therefore where the fold line will be established no matter how the fold is made. Hence by deciding the location of the folding recesses 7 a precise folding line can be predetermined.

FIG. 1b illustrates the profile 1 of FIG. 1a when folded.

The profile 1 is typically made of a metal such as aluminium, steel, iron or the like. The material of the profile 1 is determined by the use of the cabinet frame 2 which is formed from the profiles 1. Hence if the cabinet frame 2 is going to be moved around lighter materials are used whereas if the cabinet frame 2 designed to carry heavy components, stronger more heavy materials are typically used.

Due to the assembly of the cabinet frame of the present invention the frame when assembled is not completely ridged. However, when side, bottom and/or top panels are mounted to the frame together these elements form a ridged cabinet complying with requirements for installations e.g. in wind turbines.

If the cabinet 2 is used for electric equipment, it is preferred that the profiles are having at least two plans for being able to easy mount of side panels, hence typically square formed profiles 1 are used in that also equipment often needs to be fastened to the frame inside the cabinet 2. The profiles may have any geometry including circular and triangular depending on use and price. Using other geometry than square formed may led to profiles 1, which when folded have other geometry than square formed.

The folding area 3, preferably including the holes 4, is preferably cut by a laser cutting process, such process includes establish 3D drawings of the profile 1 and especially the folding areas 3, providing them to a controller of a laser cutter which then cuts the profile 1 according to the drawings.

FIG. 1b illustrate a profile as the profile illustrated on FIG. 1a. The profile 1 of FIG. 2a includes an additional cutout part illustrated with reference number 5a. FIG. 2b illustrates to profile 1 with the additional cutout part 5a when folded. It is noted, that the additional cutout part leaves an opening in the corner of the fold in the side perpendicular to the folding direction. The opening can be used to insert a corner fitting 9 as will be described below.

FIGS. 6a, 6b, 7a, 7b illustrates embodiments of the invention where the folding areas 3 do not comprise the folding area support part 6. Even though the folding area support part 6 adds precision and strength to the folded profile and thereby the cabinet, the profiles may be folded without.

FIG. 3 illustrates a corner support 8 which is mounted to the profile 1 on both sides of the folding area 3 according to an embodiment, where the fastening is made by means of bolts and nuts. In other embodiments, the corner support 8 is mounted by means of bolts tightened in a block comprising nuts which can be positioned inside the profile. In yet another embodiment a threat block comprising threat instead of nuts is used. In yet another embodiment instead of bolts, rivets may be used. As illustrated, the corner support may also be tightened to and thereby fastening a corner fitting 9 inside the profile 1.

As illustrated the corner support 8 may comprise a hole 10 which facilitates fastening two corner supports 8 from two different cabinet frames 2 to form one large cabinet frame 2. It should be noted that the corner supports 8 may only be temporary support used e.g. if the cabinet frame 2 is to be moved or handled in other ways or even not used at all. The latter is preferred if the side panels of the cabinet frame are strong enough to maintain the cabinet frame sufficiently ridged. The corner support 8 may be used as an alternative or in addition to the corner fittings 9.

The corner fitting 9 preferably comprise a first and a second part 9a, 9b. On FIG. 3, the first part 9a is positioned inside the profile 1 whereas the second part 9b is extending outwards perpendicular to the folded corner. Hence the folded corner and the second part of the corner fitting 9b from the joint corner extents outwards in three planes which having angles of 90° degrees between the planes. As illustrated, a first subpart 9a1 of the first part 9a is located in the folding area 3 and a second subpart 9a2 of the first part 9a is located inside the profile part extending in the Y-plane. Hence, if the corner of the profile is established by a first part of the profile extending in the X-plane, and a second part of the profile extending in the Y-plane, then the second part 9b of the corner fitting 9 extends in the Z-plane. This is the same plane as a third part of the profiles extends as illustrated in FIG. 4c.

The corner fitting 9 is used to connect two profiles. Hence if a folding area 3 comprise an additional cutout part 5a as illustrated in FIGS. 2a and 2b, it is possible to mount a corner fitting 9 before the profile is folded 1 facilitating that to this corner another folded profile corner or end of a profile can be mounted thereto. Accordingly, the corner fitting 9 may as the corner support 8 facilitates assembly of two adjacent folded profiles/cabinet parts and thereby at least for this purpose make the corner support 8 superfluous.

The first and second part of the corner fitting 9a, 9b may be removably attached e.g. by a threated part in the first corner fitting part 9a and a corresponding threated part in the second corner fitting part 9b. In this way e.g. during transport the second part may be an anchor via which the cabinet frame 2 can be lifted or fastened. Afterward, the anchor can be replaced by a fitting part that can serve e.g. the purpose of connecting two panels 1 or simply removed to allow a side panel to be mounted.

The corner fitting 9 is preferably fastened by pushing its first part 9a inside the profile.

A flexible part of the first part 9a may then be pushed over a notch or protrusion located at the inner side of the profile and thereby "click mounting" the corner fitting to the profile.

By "click mounting" (example of a releasable mounting method) the folded profiled, the cabinet frame becomes collapsible. A collapsible cabinet frame should be understood as a frame the parts of which can be separated after having been assembled. This is advantageous e.g. at end of lifetime of the frame. Here all parts of the panel can be dismantled without cutting or destroying the parts, thereby allowing a higher degree of reuse of these parts such as the corner fittings. Further, handling including transportation of a frame that has reached its end of life time is optimized in that the panel parts can be detached and the individual profiles can be unfolded/collapsed so that they extend in only one plan (e.g. substantially straight in the X-plan). Further, the corner fittings which might be in a different material than the profiles and since they are releasable mounted, they may be detached/removed and thereby it is easy to sort out the different parts of the frame for reuse.

Furthermore, the corner fitting 9 may be T-shaped (not illustrated) having two second corner fitting parts 9b extending opposite directions from the first corner fitting part 9a. Such T-shaped corner fitting is advantageous if two panel frames are to be mounted together in that then one frame side/panel side may be superfluous in that the two panel frames can share one side.

The corner fitting 9 is preferably molded or 3D printed in a suitable material such as plastic or metal depending on the required strength required. It should be mentioned that the corner fitting 9 may comprise threat e.g. in form of an embedded nut which can be used to receive a bolt from a supporting base or foundation and thereby be the fixation point of the cabinet frame e.g. to the base frame on which it is located. A temporary lifting eye may also be mounted in such threated part. To save material, the corner fitting 9 is preferably not completely massive, however the design of the corner fitting may vary depending on requirements to the fittings/cabinet frame.

The corner fitting 9 can be designed so that its dimensions are just a bit smaller than the dimensions of the interior of the profile 1 so that when the corner fitting 9 is mounted e.g. by gently hammering it into position inside the profile 1 the friction between the corner fitting 9 and the inside walls of the profiled 1 fastens the corner fitting 9 inside the profile 1. When the profiled 1 afterwards are folded the corner fitting 9 is permanently fixed in its position.

FIG. 4a-4d illustrates how profiles can be folded according to the present invention to form a cabinet frame 2. FIG. 4a illustrates a profile 1 having a first folding area 3a and a second folding area 3b. It is noted at least from the enlarged illustrations hereof, that the sides of the profile which are removed i.e. forming the cutout part 2 and the additional cutout part 5a are rotated 90° degrees relative to one another. The effect hereof is illustrated on FIGS. 4b and 4c.

Typically, the part of the profile 1 between the two folding areas 3 defines the "height" of the cabinet frame 2 whereas one of the parts of the profile 1 on the outer side of the folding areas 3 defines the width and the other part defines the length of the cabinet frame 2.

FIG. 4b illustrates folding the first folding area 3a and thereby creating a first angle 11a perpendicular to the profile in a first direction. FIG. 4c illustrates folding the second folding area 3b and thereby creating a second angle 11b perpendicular to the profile in a second direction. Accordingly, FIG. 4c illustrates a profile 1 folded in a first and in a second direction resulting in a profile extending in the X, Y and Z plane. With reference to the X, Y and Z terminology, the straight profile illustrated in FIG. 4a extends in one plane which could be defined as the X-plane. When folded and thereby creating the first angle 11a on FIG. 4b, the profile extends in two plans which are perpendicular to each other. The plane created by folding 11a the profile at the first folding area 3a could with reference to the X-plane be defined as the Y-plane. When folded and thereby creating the second angle 11b on FIG. 4c, the profile extends in three planes which mutual perpendicular to each other. The plane created by folding 11b the profile at the second folding area 3b could with reference to the X-plane and Y-plane be defined as the Z-plane.

Hence, FIG. 4c illustrates one profile 1 extending in the X, Y and Z-planes. When folding four similar profiles, they can be used to assemble a cabinet frame 2. Because the four profiles are structural identical (all extending in the X, Y and Z-plane) they can only be assembled in one way to form a cabinet frame. This is advantageous mounting errors simply are eliminated.

In an embodiment of the invention where the folding areas 3 does not include an additional cutout part 5a, the profiles illustrated on FIG. 4d can be mounted by welding or by means of mountings that can be clicking or bolting the profiles together.

FIG. 4d illustrates dimensions of a typical cabinet frame the height of which are often larger than the width and dept. Accordingly, each of the four profiles have one "vertical part" vp the length of which is often larger than the length of to two "horizontal parts" hp1, hp2. When assembled, the first horizontal parts hp1 are forming one side (on FIG. 4d, top side) of the cabinet and the second horizontal parts hp2 are forming another side (on FIG. 4d, bottom side) of the cabinet. The front/back/sides of the cabinet are formed by a vertical part vp and a first horizontal part hp1 from a first profile and a vertical part vp and a second horizontal part hp2 of a second adjacent profile. The top side of the panel is therefore formed by four first horizontal parts hp1 in the same plan from four different profiles. The bottom side of the panel is therefore formed by four second horizontal parts hp2 in the same plan from four different profiles.

FIGS. 4c-4d does not illustrate to insert a corner fitting 9 in any of the corners even though the additional cutout parts 5a are illustrated on FIG. 4a. the corner fittings 9 are the preferred method of assembling the four profiles to establish a cabinet frame. When used, the first part 9a of the corner fittings 9 are prior to folding each corner inserted inside the profile as described in relation to FIG. 3. Upon folding four identical profiles 1a-1d as illustrated on FIG. 4d, the cabinet frame 2 can be assembled be means of the not illustrated corner fittings 9.

The assembly of the four folded profiles 1a-1d to form a cabinet frame 2 can be made in at least two different ways. As mentioned above, the mounting of two profiles to each other is preferably made by means of the corner fittings 9. With this said, other types or designs of corner fittings can be used to connect the profiles 1 such as corner support 8 like mountings, spliced with joint bars, welding or soldering, etc.

The assembling of the cabinet frame 2 can include the following steps, establishing a first folding area 3a in a profile 1, the first folding area 3*a* comprise a cutout part 5 oriented in a first direction and a folding angle support part 6. Folding the profile 1 in an angle defined by the folding angle support part 6 of the first folding area 3*a* in the first direction and repeating steps mentioned to establish four folded profiles 1*a-d*. Connecting profile 1*a* and profile 1*b*, thereby forming part of a first side of the cabinet frame 2. Connecting profile 1*c* to profile 1*b*, thereby forming part of the second side of the cabinet frame 2. Connecting profile 1*d* to profile 1*c* and profile 1*a*, thereby forming part of the third and fourth sides of the cabinet frame 2, and connecting a bottom frame to each of the ends of the profiles 1*a*-1*d*.

One way to assemble a cabinet frame 2 from folded panels are to mount a first folded profile 1*a* and a second folded profile 1*b*, then mount a third folded profile 1*c* to the second folded profile 1*b* and finally mount a fourth folded profile to the first and third folded profiles 1*a*-1*d*. Another way is to mount a first folded profile 1*a* and a second folded profile 1*b* (see FIG. 5 step 1 and step 2) thereby assemble a first cabinet frame part 2*a*. Then mount a third folded profile 1*c* and a fourth folded profile 1*d* (see FIG. 5 step 3 and step 4) thereby assemble a second cabinet frame part 2*b*. The two cabinet frame parts 2*a*, 2*b* can then be assembled to form the cabinet frame 2 (see FIG. 5 step 5 and step 6).

The folding and interconnection of profiles 1 can be made manually or automated. The manual or automated assembling, the works space available to the assembling or other factors are determining for the way or steps (and order hereof) of the assembling.

From the above it is now clear that the present invention is directed to a profile (of any geometry, but preferably square formed) in which a folding area 3 is established. The establishing of the folding area 3 is preferably done by laser cutting (or stamping).

The folding areas 3 comprise an area where the profile material is removed facilitating a fold of the profile at/towards this area, this area is referred to as cutout part 5.

The folding area 3 also comprise a fold support part 6 comprising a protruding part 6*a* and a cave in part 6*b*. When the profile is folded, the fold support part 6 defines the folding angle, the precision hereof and helps the profile to stay in the folded positon.

The folding area 3 may also comprise holes 4 for fastening accessories (such as corner fittings 9 and corner support 8) and/or folding recesses 7 which facilitates folding with less force compared to folding a profile without folding recesses 7. The folding recesses also insured a precise folding in that a folding line inevitable will be established between the folding recesses 7. Hence by determining the location of the folding recesses 7, the folding line is (pre) determined. Both holes 4 and folding recesses 7 are preferably established by laser cutting. The folding recess 7 may have a different geometry than the one illustrated in the figures as long as it fulfils its purpose of allowing the folding of the profile. Even though preferred, the folding recess may not always be necessary to be able to fold the profile, however if not present it may lead to post treatment of the folded profile.

When folded, the profiles can be assembled to form a cabinet frame 2. More cabinet frames 2 can be assembled together if larger cabinet frames 2 are desired. The cabinet frames 2 can be used for electric equipment, storing, music, light and/or sound equipment, and the like.

Preferably to profiles are made of aluminium, so no surface treatment is mandatory for corrosion protection. In case the profiles are made of steel, preferably they will have a corrosion protection coating or treatment as will the holes made in the profiles. The profiles can also be made of a plastic material. The material is determined by the size of the resulting profile, the purpose/use of the resulting profile, etc.

Preferably, the thread is made in holes facilitating fastening bolts for holding corner fittings 9, corner support 8, internal fittings for holding e.g. electric components inside the panel to the panel. Alternatively, clip nuts can be used instead of making threat in the holes.

Fittings for holding material inside the resulting panel may be made of a plastic material. A recess is preferably made in the profile at which the fitting can rest. The fitting can then be fastened to the profile by a bolt thereby fixing it in its position in the recess so that load from the material attached to the fitting is mainly carried by the recess and less carried by the bolt. This is advantageous in that it reduced number of holes in the profile thereby maintaining the strength of the profile.

From the above description it is now clear that the present invention relates to a cabinet frame 2 made from profiles 1 having folding areas 3 at predefined locations enabling a precise fold of the profile which thereby defines length, width and or depth of the cabinet frame 2. The angle, precision and fixation of the fold is preferably determined by the folding support part 6.

When e.g. four profiles are folded, then can be connected preferably by corner fittings 9 and/or corner support parts 8. The connection can be made in various ways e.g. two times two profiles are connected and then these two half panel parts are connected. This enables connection in one direction, which is advantageous if the folding and connection process is to be made by a robot. An alternative way of connecting is to connect the profiles one by one after they have been folded.

In theory, a cabinet frame can be assembled by two or more folded or non-folded profiles in different combinations, however four profiles has been proved to give the best result in relation to stability, weight, assemble time and strength.

Beside the advantageous folding process leading on onsite production of cabinet frames, the huge advantage is the reduced footprint of the individual panel 1 when stored both during transportation and on stock. The footprint of four unfolded profiles takes up only a fraction of the footprint of a resulting folded and connected cabinet frame.

The initial steps of establishing folding areas 3 in the profile 1 may be done at a location different from the location where the folding steps are made. i.e. in one production facility the folding areas are established then, there may be a transportation step where the profiles are transported to a second location prior to the folding and assembling of the cabinet, preferably electric cabinet at this second location. Whether or not the transportation is prior or after folding (to mounting location of electric components), the advantage in transportation the profile and not the folded cabinets must be highlighted.

LIST

1. Profile
2. Cabinet frame
3. Folding area
4. Holes
5. Cutout part
6. Folding support part
7. Folding recess
8. Corner support
9. Corner fitting 10. Hole
11. Folding angle
vp. Vertical part
hp. Horizontal part

The invention claimed is:

1. A method of assembling a cabinet frame, the method comprising the steps of:
   a) establishing a first folding area in a profile, the first folding area comprises a first cutout part oriented in a first direction,
   b) establishing a second folding area in the profile, the second folding area comprises a second cutout part oriented in a second direction perpendicular to the first direction,
   c) folding the profile at the first folding area in the first direction defined by the first cutout part,
   d) folding the profile at the second folding area in the second direction defined by the second cutout part,
   e) repeating steps a)-d) to establish four folded profiles, and
   f) connecting the four folded profiles to form a cabinet frame,
      wherein the step of connecting the four folded profiles to form a cabinet frame includes the steps of:
         connecting a first of the four folded profiles and a second of the four folded profiles, thereby forming a first side and part of a second side and fourth side of the cabinet frame,
         connecting a third of the four folded profiles to the second of the four folded profiles, thereby forming the second side and part of a third side of the cabinet frame, and
         connecting a fourth of the four folded profiles to the first and third profiles of the four folded profiles, thereby forming the third and fourth sides of the cabinet frame.

2. The method according to claim 1, wherein the step of connecting the four folded profiles to form a cabinet frame includes the steps of:
   connecting a first of the four folded profiles and a second of the four folded profiles, thereby forming a first cabinet part,
   connecting a third of the four folded profiles and a fourth of the four folded profiles, thereby forming a second cabinet part, and
   connecting the first and second cabinet parts, thereby forming the cabinet frame.

3. The method according to claim 1, wherein the first and second folding areas further includes an additional cut-out part.

4. The method according to claim 1, wherein step c and step d includes mounting a corner fitting in the profile at the first folding area and at the second folding area prior to folding,
   wherein a first part of the corner fitting is mounted inside the profile leaving a second part of the corner fitting extending outside the profile at an additional cut-out part when the profile is folded.

5. The method according to claim 4, wherein the four folded profiles are mounted by the corner fittings, and wherein each said corner fitting comprises a nut, threaded part or a flexible protruding part by which the corner fitting is fastened to the profile.

6. The method according to claim 1, wherein at least one of step a and step b further includes establishing a folding angle support part, and wherein at least one of step c and step d further includes folding the profile in an angle defined by the folding angle support part.

7. A cabinet frame assembly including four profiles and eight identical corner fittings, wherein the four profiles are identical and each comprises a first folding area and a second folding area, the first folding area being rotated 90 degrees on the profile with respect to the second folding area,
   wherein each of the first and second folding areas comprises a cutout part and an additional cutout part, wherein the cutout parts are turned 90 degrees on the profile with respect to the additional cutout parts,
   wherein the corner fittings each have a first part perpendicular to a second part, wherein dimensions of the first and second parts are identical thereby facilitating mounting inside the profiles, and
   wherein the additional cutout part facilitates one of the first or second part to extend out from the profile when a second of the first or second part is mounted inside the profile.

8. The cabinet frame assembly according to claim 7, wherein each of the first and second folding areas further comprises a folding angle support part comprising a protruding part and a cave in part.

* * * * *